United States Patent [19]

Suzuki et al.

[11] Patent Number: 4,521,082

[45] Date of Patent: Jun. 4, 1985

[54] EXPOSURE APPARATUS

[75] Inventors: Akiyoshi Suzuki; Hirosi Sato, both of Tokyo; Takashi Omata, Yokosuka; Masao Kosugi, Yokohama, all of Japan

[73] Assignee: Canon Kabushiki Kaisha, Tokyo, Japan

[21] Appl. No.: 401,895

[22] Filed: Jul. 26, 1982

[30] Foreign Application Priority Data

Aug. 8, 1981 [JP] Japan ................................. 56-124211

[51] Int. Cl.$^3$ ............................................... G02F 1/01
[52] U.S. Cl. .................................... 350/405; 350/403; 356/400
[58] Field of Search ................. 356/400; 350/403, 405; 355/52

[56] References Cited

U.S. PATENT DOCUMENTS

| | | | |
|---|---|---|---|
| 4,052,603 | 10/1977 | Karlson | 356/400 |
| 4,153,371 | 5/1979 | Koizumi et al. | 356/401 |
| 4,406,546 | 9/1983 | Suzuki | 356/400 |

OTHER PUBLICATIONS

Bennett et al., "Polarization", Sec. 10 of Handbook of Optics, McGraw Hill, 1978, Driscoll et al. Editors, pp. 10-102 through 10-115.

Primary Examiner—William H. Punter
Attorney, Agent, or Firm—Fitzpatrick, Cella, Harper & Scinto

[57] ABSTRACT

An exposure apparatus includes a reticle provided with at least one mark, and operates on a wafer provided with at least one mark. The apparatus further includes a projection optical system for optically conjugately relating the reticle to the wafer, a mark detecting apparatus for detecting the mark of the reticle and detecting the mark of the wafer through the projection optical system, an illuminator for illuminating the wafer with a sensitizing light, and a phase converting element fixed between the wafer and the reticle for varying the direction of polarization of a light coming from the mark provided on the wafer.

11 Claims, 5 Drawing Figures

EXPOSURE APPARATUS

BACKGROUND OF THE INVENTION

1. Field of the Invention

This invention relates to a semi-conductor wafer printing apparatus, and more particularly to an apparatus in which a circuit pattern lying on a reticle is positionally-adjusted onto a wafer and exposed to light.

2. Description of the Prior Art

The recent tendency of to make wafers of larger size and to make circuit patterns of finer design has created various problems which have not been salient in the conventional projection exposure system.

Such problems include, for example, the problem of thermal expansion or contraction of the wafer resulting from the ambient temperature, the problem of strain of the wafer during the semiconductor manufacturing process, and the minute deformation of the transferred pattern caused the characteristics of the exposure apparatus used. These problems have become serious as the circuit pattern has been made more minute for the purpose of higher integration of the electronic circuit. Among various wafer exposure methods, the step-and-repeat method is suitable to solve the abovenoted problems. This method has the following advantages:

(1) Adoption of a reduction imaging system makes it easier to design a lens of high resolving power.

(2) Each exposure is carried out on a small section of a wafer. This can remarkably alleviate the influence of the minute deformation of the wafer.

(3) The use of a reduction system as the projection lens makes it less susceptible to the influence of dust on the reticle side.

The system of the stepper may generally be classified into the off-axis method and the TTL (through the lens) method. The off-axis method has an alignment microscope whose position relative to the projection lens is known. This microscope used to position the wafer. The wafer, after positioned, is accurately transferred by a predetermined amount and that state of the wafer is regarded as the standard state. This method is indirect alignment method. Therefore, it has the disadvantages that it is liable to cause errors and that it is difficult to cope with the random component (random localization) of the deformation of the wafer.

On the other hand, the TTL method is a method in which the aligned condition of the reticle and the wafer is observed through an imaging lens directly. The TTL method is superior to the off-axis method in that there is no necessity of providing a reference position in addition to the imaging lens as is done in the off-axis method.

A great advantage of the stepper is that alignment is carried out and optimized with respect to each section of the wafer. This procedure increases the accuracy of alignment. The TTL method also is meritorious in that the aligned condition can be confirmed for each shot through the imaging lens, and this leads to the possibility of ensuring total alignment accuracy.

In the TTL method, however, chromatic aberration exists in the projection lens. It is therefore only in the printing wavelength that the reticle is focused to the wafer. In the other wavelengths, the reticle is out of focus to the wafer. To enable the reticle to be focused to the wafer in the other wavelengths, it is known to change the part of the projection lens or to insert a lens additionally. These methods are meritorious in that the use of a light which does not sensitize photoresist can be permitted, while they are disadvantageous in that mechanical errors arising from the use of additional optics may again cause an alignment error.

SUMMARY OF THE INVENTION

It is an object of the present invention to provide an exposure apparatus capable of realizing the TTL method in which a first body such as a reticle and a second body such as a wafer are observed through a projection optical system directly, whereby the amount of deviation is detected.

It is another object of the present invention to provide a highly accurate apparatus in which the aligned condition of a reticle and a wafer prepared for exposure is directly confirmed. Then the exposure operation follows while the relation between the reticle and the wafer is maintained. That is, the projection optical system is maintained in the same state during both alignment and exposure.

It is still another object of the present invention to provide an exposure apparatus in which alignment marks can be set at arbitrary positions in the field of view of the projection lens in accordance with the variation in size of the electronic circuit pattern on the reticle. There is no necessity of predetermining any special positions the apparatus which abounds in flexibility of designing of the reticle.

It is yet still another object of the present invention to provide an exposure apparatus having an alignment function which has a contrast emphasizing function capable of detecting an alignment signal even from a wafer of low contrast.

It is a further object of the present invention to provide an exposure apparatus in which a polarizing element is inserted in the projection optical system to separate a signal coming from the reticle and a signal coming from the wafer during alignment. Consequently, it is possible to take out these signals independently of each other.

It is still a further object of the present invention to provide an exposure apparatus in which, during alignment, detection is carried out by the use of a light of a wavelength identical or equivalent to that of the exposure light and which is not affected by the chromatic aberration of the projection lens.

The inventon will become fully apparent from the following detailed description thereof taken in conjunction with the accompanying drawings.

DESCRIPTION OF THE PREFERRED EMBODIMENTS

Figure 1:
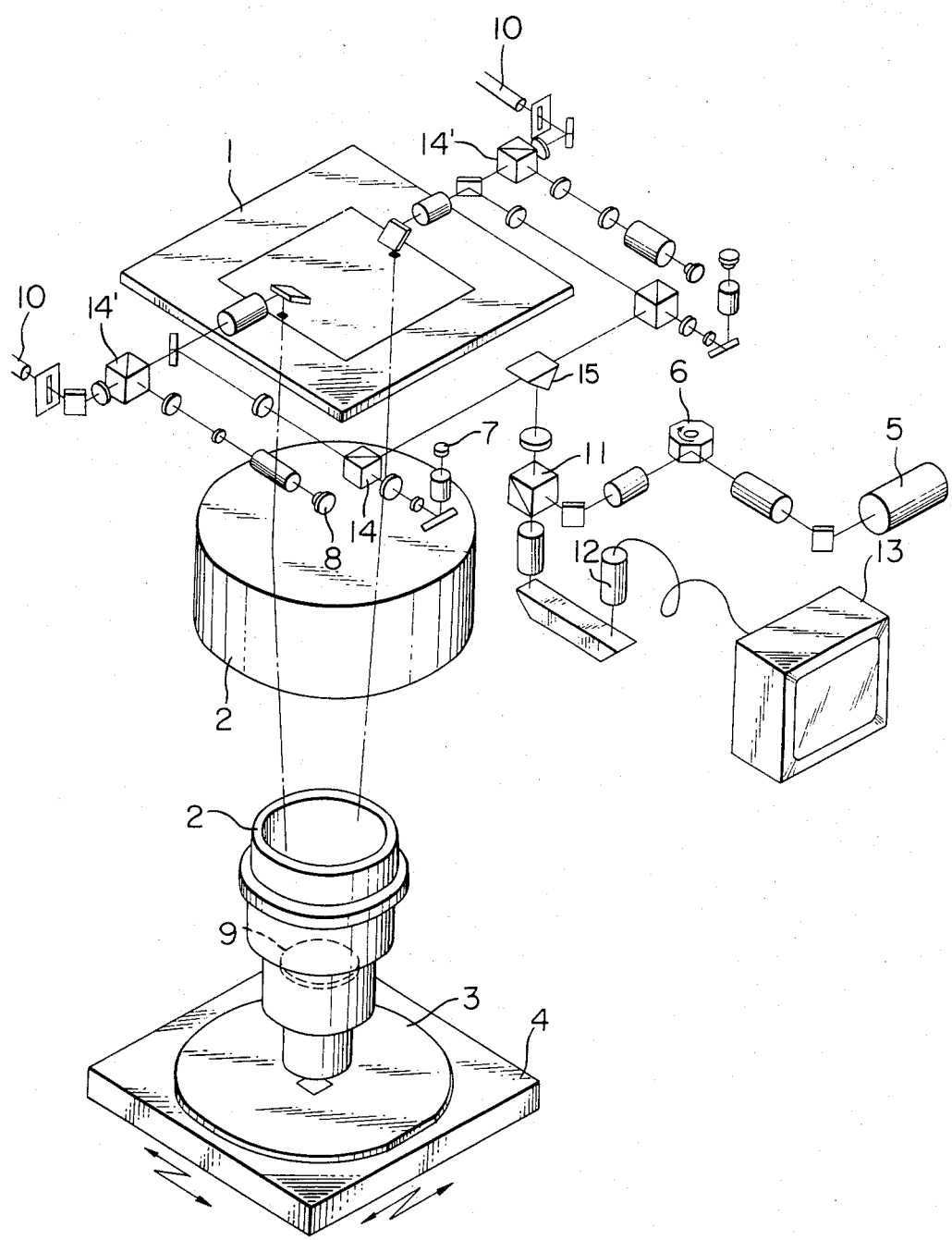
FIG. 1 is a perspective view of an optical system showing a specific embodiment of the present invention.
Figure 2A:
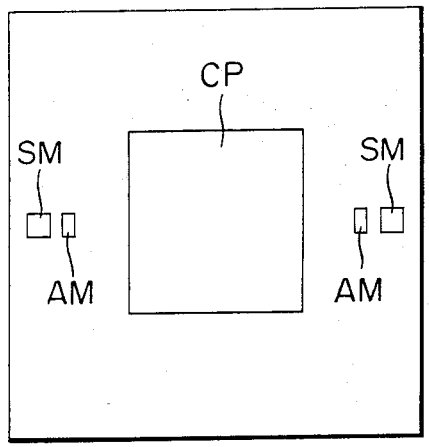
FIG. 2A is a plan view of a reticle according to the prior art.
Figure 3:
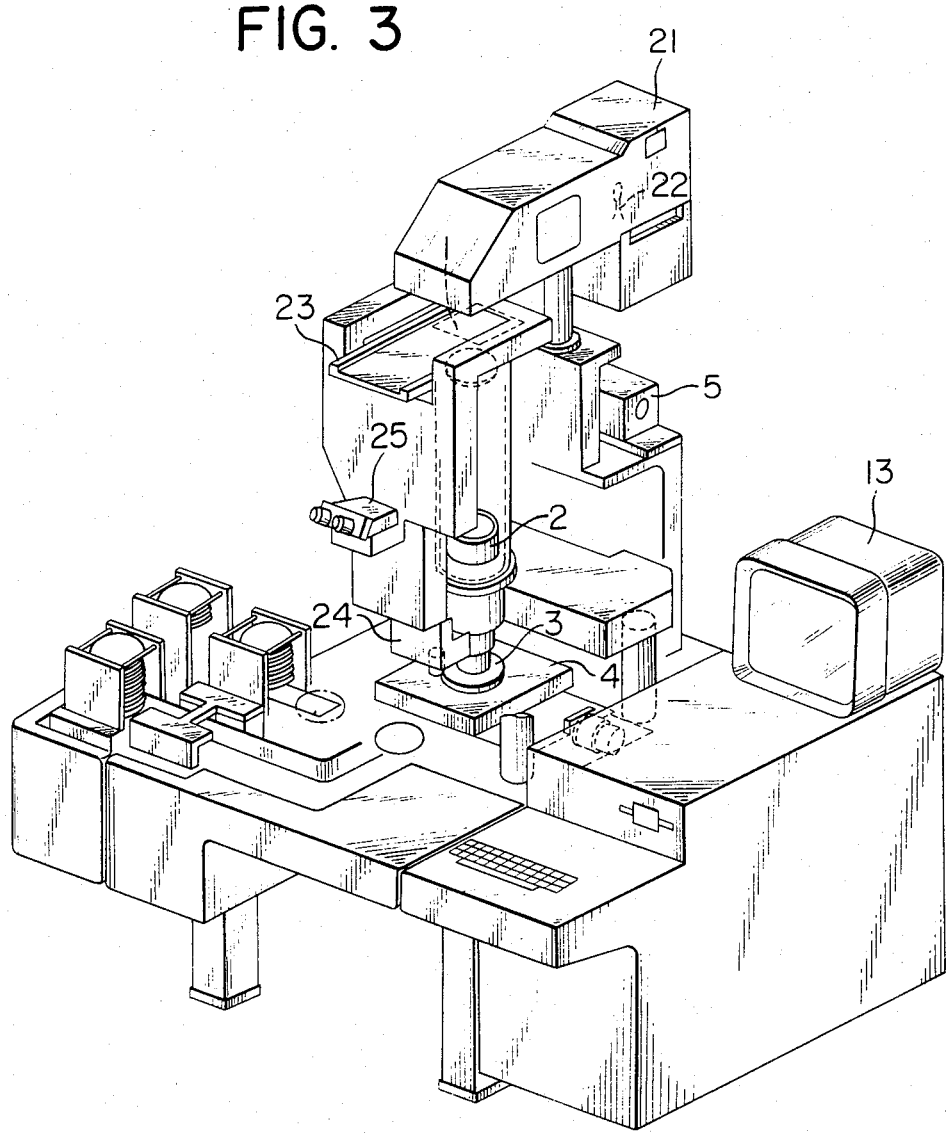
FIG. 3 is a pictorial perspective view of an exposure apparatus.

FIG. 1 depicts an optical system housed in an exposure apparatus shown in FIG. 3. Referring to FIG. 1, a reticle (mask) 1 is provided with an electronic circuit pattern CP and marks AM for alignment as shown in FIG. 2A. A wafer 3 has a photosensitive layer provided on the surface thereof. A reduction projection lens 2 is designed so as to be a telecentric system relative to both the reticle 1 side and the wafer 3 side. That is, a principal light ray emergent from the projection lens 2 is incident on the wafer 3 perpendicularly and also on the reticle 1 perpendicularly thereto.

The reticle 1 and the wafer 3 are optically conjugately related to each other by the projection lens 2, and the reticle 1 is imaged on the wafer 3 through the projection lens 2. The reticle is placed on a reticle stage (not shown) and is subjected to the following adjustment in advance so as to satisfy a predetermined relation. That is, the reticle is aligned by using the initial position setting marks SM (FIG. 2A) and the reticle setting is completed by matching these marks with marks provided on the apparatus body. The matching operation is effected by a reticle driving stage, not shown, and an alignment scope system mounted in such a fashion as to observe these marks simultaneously, is utilized for the detection of the amount of drive. In the system of the present invention, the deviation between the reticle and the wafer is directly measured and corrected. Therefore, the position setting of the reticle is not so severe as in the aforedescribed off-axis system. The reticle setting marks provided on the apparatus body are set so as to match X-axis and Y-axis which are the step axes of a wafer stage 4 which stepmoves the wafer. Thus, when the setting of the reticle has been completed, the X-axis and Y-axis of the reticle become highly accurately parallel to the X-axis and Y-axis, respectively, of the wafer stage. This accuracy has a close relation with the amount of alignment correction to be effected when the wafer is stepped to the next exposure position. The set marks of the reticle can be set independently of the circuit pattern on the reticle. Their positions are predetermined because the position of the corresponding marks on the apparatus side are fixed. When alignment of the reticle is to be effected, the objective lens of the alignment scope is moved to a position corresponding to the marks and the marks are photoelectrically detected. This alignment scope can also be used in a reticle and wafer alignment operation.

After the setting of the reticle has been completed, the procedure of alignment adjustment with respect to the actual wafer and that of exposure will be performed.

On the other hand, as already mentioned, the case of the TTL method involves the problems of chromatic aberration of the projection lens and of time accompanying the operation. As the stepper requires very fine alignment accuracy, it is preferable to observe the matching condition between the reticle and the wafer with the light of wavelength used for exposure or wavelength very close thereto by directly using the projection optical system itself without the intermediary of any additional lens or the like. On the basis of such idea, photoelectric detection has heretofore been performed by using a mercury lamp as the light source. However, as is well known, the wafer is a light-reflecting body and therefore, in the conventional bright field detection method sufficient contrast sometimes cannot be obtained. As a solution to this problem, detection may be carried out with a dark field method which optically increases the contrast, but in a system wherein the light from the mercury lamp is directed by a number of optical fibers, brightness is deficient.

A photoelectric detecting system which solves the problem of deficient quantity of light and which is capable of dark field detection is disclosed for example in Japanese Laid-open Patent Application No. 132851/1977 (U.S. Pat. No. 4,199,219). This system uses a laser which can provide a high brightness as a light source, and a laser beam is scanned on an object surface. A He-Ne laser usually having an wavelength of 632.8 nm is normally used.

In this system according to the present invention, the projection optical system is corrected for g-line (436 nm) or g-line and h-line (405 nm). Use of a He-Ne laser (632.8 nm) is improper because it will cause too great chromatic aberration. Accordingly, the present invention employs a He-Cd laser having a wavelength of 441.6 nm close to g-line. Since this wavelength is in the vicinity of g-line at which the projection lens is corrected, the amount of aberrations created in the wavelength 441.6 nm is small. It has been found that the projection lens shows high performance and that deterioration of the image is hardly perceived. Accordingly, using a He-Cd laser in the apparatus of the present invention, the stepper has the possibility of realizing the laser scanning optical system as in the conventional apparatus.

Figure 2B:
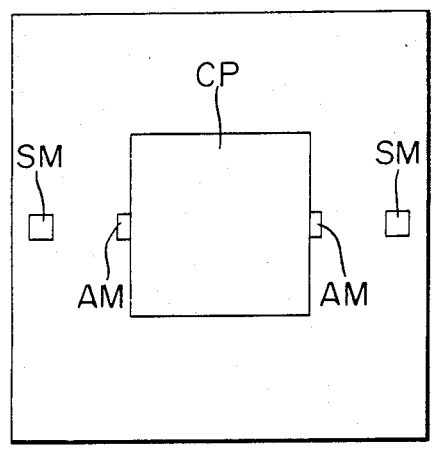
FIG. 2B is a plan view of an improved reticle.
Figure 2C:
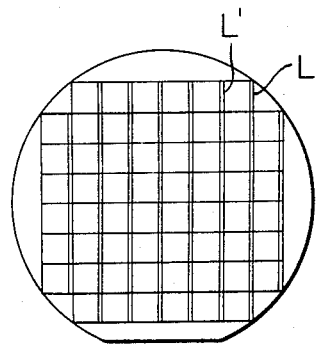
FIG. 2C is a plan view of a wafer.

The projection optical system of FIG. 1 has an additional feature that it is telecentric relative to both the reticle side and the wafer side. Since the principal light ray is perpendicular to the reticle, the light ray incident on the objective lens of the alignment scope is in the same condition to wherever it may be set with respect to the reticle. In most of the known projection optical systems, the reticle side is not telecentric. Accordingly, if the position for observing the reticle is changed, the direction of the principal light ray incident on the objective lens of the alignment scope changes and the direction of the light reflected back from the wafer changes. This had led to a disadvantage that the alignment scope is adjusted for a particular position of the reticle and alignment can only be accomplished at that position. The position whereat the alignment marks are placed is determined independently of the size of the circuit pattern set on the reticle and therefore, the alignment operation becomes complicated as follows. FIG. 2C depicts the wafer. L and L' designate scribe lines for separating the wafer into dies. It is desired that the alignment marks of the wafer be provided on these lines, while the position of the alignment marks on the reticle is predetermined. Accordingly, the alignment at a predetermined position only means that the alignment marks of the reticle and wafer are aligned with each other. However, it does not mean that the circuit pattern already transferred onto the wafer is aligned with the circuit pattern on the reticle. As shown in FIG. 2A and FIG. 2C, the distance between the center of the alignment mark AM of the reticle of FIG. 2A and the center of the circuit pattern generally differs from the distance between the center of the alignment mark of the wafer and the center of the circuit pattern even if the magnification of the projection system is taken into account. This deviation is a known amount. In the conventional system, therefore, the alignment between the reticle and the wafer is not completed until the wafer is moved by a predetermined amount with the accuracy of 0.1 $\mu$m after the alignment marks have become coincident with each other. Accordingly, in the conventional method, after the alignment marks have become coincident, a stepping sequence dependent on the accuracy of a stage using a laser interferometer or the like is unavoidably needed. This leads not only to the complexity of the sequence but also to great loss of time and the requirement of high accuracy of the apparatus. The environment setting is also required to maintain high accuracy of the laser interferometer. As previously mentioned, this is attributable to the facts that the reticle side of the projection lens is not telecentric and that the position whereat the alignment marks can be set is restricted, as previously described.

There are two reasons for rendering the wafer side telecentric. One is the problem of wafer observation and the other is the stability of the image size due to the defocus, as seen in applicant's Japanese Patent Publication No. 11704/1979 (U.S. Pat. No. 3,794,421). In the embodiment of the present invention, the reticle side is also rendered telecentric, so that the limitation on the alignment mark setting position is eliminated. Thus, the alignment marks AM can be placed at any positions on the reticle and can be placed, for example, into locations corresponding to the scribe lines, adjacent to the circuit pattern of the reticle (FIG. 2B). An optical system in which even the reticle side is rendered telecentric has already been put into practice in a one-to-one magnification projection device or the like, and it plays an important role also in this stepper.

The fact that alignment marks can be disposed adjacent to the circuit pattern means that coincidence between the alignment marks directly leads to coincidence between the circuit pattern of the reticle and the circuit pattern of the wafer. Accordingly, when the alignment scope observing the alignment marks goes to a state in which it does not interfere with the exposure light after the alignment operation, the reticle and the wafer enter the exposure operation while maintaining a mutual relationship with each other. The system of the present invention is higher in stability because it is not burdened with the error factor such as the stepping with high accuracy by a predetermined amount in order to make the circuit patterns coincident with each other as was done in the prior art.

Another advantage of rendering the reticle side telecentric is the applicability of the laser optical system described previously. FIG. 1 shows the construction of the laser optical system. In FIG. 1, reference numeral 5 designates an He-Cd laser and reference numeral 6 denotes a rotational polygonal mirror. Details of the optical arrangement are described, for example, in Japanese Laid-open Patent Application No. 24504/1981 (U.S. Pat. No. 4,406,546) and need not be described herein. In FIG. 1, a spot or slit-shaped laser beam is scanned on an object surface with the polygonal mirror. The scanning spot is scattered by the edge portion of the alignment mark when it scans over the object surface. Only the scattered light is directed to photoelectric detectors 7 and 8. Since the projection optical system is rendered telecentric on both the reticle side and the wafer side, the light perpendicularly incident to the reticle perpendicularly reflected from the reticle and returns to the alignment scope again. For the reason set forth previously, it is usually the case that the wafer side is rendered telecentric, but unless the reticle side is designed to be telecentric, the reflected light from the wafer will not return perpendicularly and it will be difficult to achieve detection of the dark field.

Accordingly, use of the He-Cd laser 5 is greatly effective in its combination with the projection lens which is telecentric on both the reticle side and the wafer side. The He-Cd laser is also greatly meritorious in that it is free from chromatic aberration and in that it casts no burden of chromatic aberration upon the design of the projection lens.

Another advantageous feature of the embodiment shown in FIG. 1 is the utilization of polarized light. Since laser light is polarized, the use of an optical element such as a polarizing beam splitter 14 can lead to efficient utilization of the light for photoelectric detection. For example, linearly polarized laser light is directed to the polarizing beam splitter 14 through lenses, polygonal mirror 6, beam splitter 11 and an image splitting prism 15, and if the direction of polarization of the laser light is disposed so as to be orthogonal to the perpendicular to the reflecting surface of the polarizing beam splitter 14, all the incident light will be reflected. Also, if the direction of polarization of the light reflected back by an object is coincident with the direction of inclination of the reflecting surface of the polarizing beam splitter 14, all the incident light will be transmitted.

Further, the influence of the reflection from the wafer is avoided when, in FIG. 1, the signal from the reticle is detected. The direction of polarization of the light, directly reflected from the reticle and coming back to the alignment scope, can be made different from that of polarization of the light reaching the wafer and then coming back to the alignment scope. That is, for example, the planes of polarization of these lights can be made orthogonal to each other. The laser beam passed through the reticle 1 passes a quarter wavelength plate 9 and is reflected by the surface of the wafer 3, whereafter the laser beam passes through the quarter wavelength plate 9 in the opposite direction. As a consequence, the direction of polarization of the laser light differs from from that of the incident laser beam by 90°. Accordingly, the light reflected by the reticle 1 differs in direction of polarization from the light reflected by the wafer 3. When the reflected light enters the polarizing beam splitters 14 and 14', the light whose direction of polarization is coincident with the direction of inclination of the reflecting surfaces of the beam splitters is transmitted through the beam splitters and the light whose direction of polarization is orthogonal to the direction of inclination is reflected and separated.

Thus, the two light beams are separated from each other, whereby the information of the reticle can be taken out as a stable signal which is not affected by the light coming from the wafer.

According to the previous system, a part of the projection lens is changed over during alignment and a λ/4 phase plate is disposed as the part of the lens inserted during that time. The separation by polarization is thus achieved. It has been mainly for the purpose of chromatic correction of the projection lens that part of the projection lens or the attachment lens are changed over. However, in the present invention, by applying a He-Cd laser which has a wavelength close to the exposure wavelength, the necessity of changing over the lenses is eliminated.

In this case, the problem of the deterioration of the resolving power arise by the insertion of a crystal element forming the λ/4 phase plate. It has been confirmed that if a place in which the on-axis imaging light beam becomes as approximate as possible to a parallel light beam is formed in the projection lens and the λ/4 phase plate is inserted in that place, the resolving power is hardly deteriorated. Assuming that the λ/4 phase plate is formed by two crystal plates cemented together, it is desirable that the following relation be satisfied:

$$\frac{2\Delta n}{n} \cdot \frac{\sin\theta \cdot \sin i}{\cos^2\theta} \cdot d \leq \lambda,$$

where d is the overall thickness of the crystal, n is the refractive index of the crystal for an ordinary light ray, $\Delta n$ is the difference in the reflective index between normal light ray and an extraordinary light ray, i is the angle of the on-axis marginal light ray incident on the $\lambda/4$ phase plate, $\theta$ is the angle of the ordinary ray in the crystal corresponding to the maximum principal ray incident on the $\lambda/4$ phase plate, and $\lambda$ is the wavelength.

The $\lambda/4$ phase plate is inserted in the projection lens, i.e., in the optical path between the reticle and the wafer. In the embodiment of FIG. 1, the $\lambda/4$ phase plate 9 is disposed at the intermediate position of the projection lens.

Thus, even if exposure is carried out with the $\lambda/4$ phase plate inserted, the resolving power is not deteriorated. In addition, separation of the photoelectric signals during alignment becomes possible with the projection lens without any additional optics.

On the other hand, in the system of FIG. 1, reference numeral 7 signifies a photodetector which receives the light having reached the wafer, and reference numeral 8 signifies a photodetector which receives the light directly coming back to the alignment scope from the reticle.

As regards the function of the rest of the system of FIG. 1, the fiber designated by 10 provides a light source for the eyes or for a TV image pick-up device 12. The light having reached the wafer is directed through a beam splitter 11 to the pick-up device 12. In the case of viewing with the eyes or observation on a TV image receiving screen 13, the laser beam may sometimes cause flare and overlap the wafer image. Therefore, it is desirable to bring about a condition in which the laser light does not enter the observation system. For example, the laser beam is intercepted by a shutter or the polygonal mirror is stopped to prevent the laser beam from entering the subsequent optical system.

Auto alignment operation may be achieved by processing the signals obtained by the detectors 7 and 8. The signal of the reticle is taken out by the detector 8 and the signal of the wafer is taken out by the detector 7. The amount of deviation between the reticle and the wafer is detected by synthesizing the two signals. On the basis of the detection signal, a wafer stage 4 or a reticle state 23 (FIG. 3) is moved, whereby the amount of deviation is corrected. After the objective lens unit has moved to a condition in which it does not interfere with the light for exposure, the shutter is released to complete exposure and the wafer stage steps to the next exposure position by a predetermined amount, whereupon the apparatus shifts to a new alignment exposure operation.

On the other hand, measurement can become very stable and highly accurate due to the synthesis of the signals of the detectors 7 and 8. If the aforementioned operation is repeated at each step, alignment is accomplished at each shot and therefore, similar and highly accurate printing can be accomplished over the front surface of the wafer. The exposure apparatus of the present invention can cope with all kinds of minute deformation of the circuit pattern on the wafer such as the deformation and thermal expansion resulting from the processing of the wafer. Also, as the alignment operation is carried out at each shot, a stage monitor such as a laser interferometer is not always required and somewhat rough step accuracy is sufficient.

FIG. 3 shows the whole view of another embodiment of the exposure apparatus constructed in accordance with the present invention. In FIG. 3, members similar to those of FIG. 1, such as the reticle, the projection lens, the wafer, etc., are given similar reference numerals. In FIG. 3, reference numeral 21 designates an illuminating unit for exposure, and reference numeral 22 denotes a super-high pressure mercury lamp as a printing light source. By this unit, g-line or g-line and h-line used for exposure are supplied to the projection system. Designated by 23 is a reticle stage. The reticle stage 23 has the function of conveying the reticle 1 and the function of setting and fine alignment of the reticle. Denoted by 24 is an off-axis microscope objective unit. For versatility, it can be used for off-axis alignment as well as for prealignment of the wafer. Designated with 25 is a binocular unit for viewing by the eyes.

The gist of the present invention has so far been described by reference to FIG. 1, but of course, the present invention is not limited to the embodiment of FIG. 1.

In the present invention, it is necessary to insert a $\lambda/4$ phase plate relative to the projection optical system, but the $\lambda/4$ phase plate may also be disposed, for example, between the reticle and the projection lens. In another example, the $\lambda/4$ phase plate may be disposed between the wafer and the projection lens. In this case, however, the thickness d, etc. of the $\lambda/4$ phase plate satisfy conditions different from the aforementioned conditions.

The present invention has been shown with respect to an example in which auto alignment is carried out for each shot, but a system is also possible in which exposure is effected while the alignment condition is sometimes checked. In that case, the amount of step for each shot may be monitored by a laser interferometer, an encoder or the like. When the alignment marks have been damaged only in a particular portion of the wafer for some reason or other, the exposure is carried out by using the monitor of the stage for only that portion.

As has hitherto been described, the present invention has realized a true TTL alignment exposure apparatus which drives the reticle and the wafer into just the same condition as the exposed condition. By using a laser beam almost equivalent to the exposure wavelength of the projection lens according to the present invention, it has become possible to construct a photoelectric detecting system of high detection rate without being subjected to any constraint by the projection lens. According to the present invention, the position of the alignment marks is arbitrary and therefore it is easy to construct an arrangement corresponding to the size of the circuit pattern on the reticle. Also, by inserting a $\lambda/4$ phase plate in the projection lens, it has become possible to separate the signals of the reticle and wafer and carry out stable measurement with high accuracy.

Accordingly, the present invention may be said to provide, mixed with a detecting system of high detection rate, an exposure apparatus having lesser error factor. It is very stable because alignment can be monitored by the actual wavelength used for printing and because the reticle and the wafer are not at all moved until the exposure is reached after completion of alignment.

what we claim is:

1. An exposure apparatus for projecting a pattern from a first body onto a second body, the second body being photosensitive, the first and the second bodies each being provided with an alignment mark, said apparatus comprising:

first support means for supporting the first body;

second support means spaced from said first support means for supporting the second body;

a projection optical system for projecting the pattern from the first body to the second body and being so arranged that, when in use, the first and second bodies are optically conjugate relative to said projection optical system;

illuminating means for illuminating the first body so that the pattern may be projected by said projection optical system onto the second body; and alignment means for aligning the first and the second bodies, said alignment means comprising a source of polarized light, an alignment optical system for projecting said polarized light onto the first body and through said projection optical system onto the second body for illuminating the alignment marks on the first and the second bodies, phase converting means positioned in the optical path between the first and second bodies for altering the polarization of the polarized light so that light reflected from the alignment mark of the first body may be distinguished from light reflected from the alignment mark of the second body, and means for separating the polarized light reflected from the respective alignment marks to permit alignment to be performed, said phase converting means being mounted to remain in position during the projection of the pattern from the first body to the second body.

2. The exposure apparatus according to claim 1, wherein said projection optical system forms therein an optical path in which on-axis marginal rays become substantially parallel, and said phase converting means is a λ/4 phase plate disposed in said optical path.

3. The exposure apparatus according to claim 2, wherein said λ/4 phase plate satisfies the following relation:

$$\frac{2\Delta n}{n} \cdot \frac{\sin\theta \cdot \sin i}{\cos^2\theta} d \leq \lambda,$$

where d is the total thickness of two crystal plates cemented together, n is the refractive index of the crystal for an ordinary light ray, Δn is the difference in refractive index between an ordinary light ray and an extraordinary light ray, i is the inclination of the on-axis marginal light ray incident on the λ/4 phase plate, θ is the angle of the ordinary light ray in the crystal of the maximum off-axis principal ray incident on the λ/4 phase plate, and λ is the wavelength of the polarized light.

4. The exposure apparatus according to claim 1, wherein said projection optical system is substantially telecentric relative to the first body and the second body.

5. The exposure apparatus according to claim 4, wherein said projection optical system is a reduction projection lens, the first body is a reticle and the second body is a wafer.

6. The exposure apparatus according to claim 1, wherein said illuminating means and said source of polarized light are operable to provide light of substantially the same wavelength, and wherein said projection optical system is a reduction system.

7. The exposure apparatus according to claim 6, wherein the first body is a reticle and the second body is a wafer.

8. The exposure apparatus according to claim 6, wherein said projection optical system is substantially telecentric relative to the first body and the second body.

9. The exposure apparatus according to claim 6, wherein said source of polarized light is a laser.

10. The exposure apparatus according to claim 6, wherein said projection optical system forms therein an optical path in which on-axis marginal rays become substantially parallel and wherein said projection optical system is substantially telecentric relative to the first body and the second body, the first and the second bodies being a reticle and a wafer, respectively, and wherein said phase converting means is a λ/4 phase plate disposed in said optical path.

11. The exposure apparatus according to claim 1, wherein the first body is provided with a circuit pattern and the alignment mark thereof is disposed adjacent the circuit pattern.

* * * * *

UNITED STATES PATENT AND TRADEMARK OFFICE
CERTIFICATE OF CORRECTION

PATENT NO. : 4,521,082

DATED : June 4, 1985

INVENTOR(S) : AKIYOSHI SUZUKI, ET AL.

It is certified that error appears in the above-identified patent and that said Letters Patent is hereby corrected as shown below:

Column 1, line 11, delete "of";
         line 20, after "caused" insert --by--;
         line 39, after "microscope" insert --is--;
         line 40, after "after" insert --it is--;
         line 42, after "state." insert --Then the wafer is exposed."; and
         after "is" insert --an--.

Column 2, line 26, after "positions" insert --on--.

Column 3, line 18, after "system" insert -- , --;
         line 36, change "position" to --positions--;
         line 44, delete "adjustment".

Column 5, line 56, after "reticle" insert --is--.

Column 6, line 34, delete "from" (first occurrence);
         line 60, change "arise" to --arises--.

Column 7, line 7, change "reflective" to --refractive--;
         line 8, change "normal" to --an ordinary--;
         line 49, change "state" to --stage--.

UNITED STATES PATENT AND TRADEMARK OFFICE
CERTIFICATE OF CORRECTION

PATENT NO. : 4,521,082

DATED : June 4, 1985

INVENTOR(S) : AKIYOSHI SUZUKI, ET AL.

It is certified that error appears in the above-identified patent and that said Letters Patent is hereby corrected as shown below:

Column 8, line 19, change "by" to --with--;
          line 21, change "by" to --with--;
          line 68, change "what" to --What--.

Signed and Sealed this

Twenty-second Day of April 1986

[SEAL]

Attest:

DONALD J. QUIGG

Attesting Officer     Commissioner of Patents and Trademarks